US007754526B2

(12) United States Patent
Jiang et al.

(10) Patent No.: US 7,754,526 B2
(45) Date of Patent: Jul. 13, 2010

(54) METHOD FOR MAKING THIN FILM TRANSISTOR

(75) Inventors: Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/384,245

(22) Filed: Apr. 2, 2009

(65) Prior Publication Data
US 2009/0286362 A1 Nov. 19, 2009

(30) Foreign Application Priority Data
May 14, 2008 (CN) .................. 2008 1 0067162

(51) Int. Cl.
*H01L 21/20* (2006.01)
(52) U.S. Cl. .................. 438/99; 438/149; 438/151; 438/486; 257/E21.415; 257/E29.003; 257/E29.151; 257/E29.297; 257/E51.023; 257/E51.031; 257/E51.049; 257/E51.051; 977/742; 977/750; 977/842; 977/932
(58) Field of Classification Search .................. 438/99, 438/149–151, 486; 257/E21.415, E29.003, 257/151, 286, 297, E51.023, E51.031, E51.049, 257/E51.051; 977/742, 750, 842, 932
See application file for complete search history.

(56) References Cited

U.S. PATENT DOCUMENTS

| 6,918,284 | B2 * | 7/2005 | Snow et al. ............. 73/31.05 |
| 7,037,767 | B2 * | 5/2006 | Hirai ......................... 438/149 |
| 7,051,945 | B2 * | 5/2006 | Empedocles et al. ...... 235/492 |
| 7,064,372 | B2 * | 6/2006 | Duan et al. ................ 257/296 |
| 7,282,742 | B2 * | 10/2007 | Tsukamoto et al. .......... 257/88 |
| 7,297,615 | B2 * | 11/2007 | Cho et al. .................. 438/486 |
| 7,368,331 | B2 * | 5/2008 | Hirai ......................... 438/149 |
| 7,399,400 | B2 * | 7/2008 | Soundarrajan et al. ... 205/777.5 |
| 7,528,448 | B2 * | 5/2009 | Bailey et al. ............... 257/352 |

(Continued)

FOREIGN PATENT DOCUMENTS

CN 1490856 A 4/2004

(Continued)

OTHER PUBLICATIONS

R. E. I. Schropp, B. Stannowski, J. K. Rath, New challenges in thin film transistor research, Journal of Non-Crystalline Solids, 299-302, 2002,1304-1310,2002.

*Primary Examiner*—Michael S Lebentritt
(74) *Attorney, Agent, or Firm*—D. Austin Bonderer

(57) ABSTRACT

A method for making a thin film transistor, the method comprising the steps of: providing a growing substrate; applying a catalyst layer on the growing substrate; heating the growing substrate with the catalyst layer in a furnace with a protective gas therein, supplying a carbon source gas and a carrier gas at a ratio ranging from 100:1 to 100:10, and growing a carbon nanotube layer on the growing substrate; forming a source electrode, a drain electrode, and a gate electrode; and covering the carbon nanotube layer with an insulating layer, wherein the source electrode and the drain electrode are electrically connected to the single-walled carbon nanotube layer, the gate electrode is opposite to and electrically insulated from the single-walled carbon nanotube layer.

19 Claims, 8 Drawing Sheets

U.S. PATENT DOCUMENTS

| | | |
|---|---|---|
| 7,537,975 B2 * | 5/2009 | Moon et al. .................. 438/149 |
| 7,582,897 B2 * | 9/2009 | Hirai et al. .................... 257/40 |
| 2007/0069212 A1 | 3/2007 | Saitoh et al. |
| 2007/0132953 A1 | 6/2007 | Silverstein |
| 2007/0273796 A1 | 11/2007 | Silverstein et al. |
| 2007/0273797 A1 | 11/2007 | Silverstein et al. |
| 2007/0273798 A1 | 11/2007 | Silverstein et al. |
| 2008/0252202 A1 | 10/2008 | Li et al. |
| 2008/0277718 A1 | 11/2008 | Ionescu et al. |
| 2009/0297732 A1 * | 12/2009 | Jiang et al. .................. 427/585 |

FOREIGN PATENT DOCUMENTS

| | | |
|---|---|---|
| JP | 2007-73706 | 3/2007 |
| JP | 2007-123870 | 5/2007 |
| JP | 2009-32894 | 2/2009 |
| WO | WO2006093601 A2 | 9/2006 |
| WO | WO2007126412 | 11/2007 |
| WO | WO2008075642 | 6/2008 |

* cited by examiner

METHOD FOR MAKING THIN FILM TRANSISTOR

RELATED APPLICATIONS

This application is related to commonly-assigned applications entitled, "THIN FILM TRANSISTOR", filed Apr. 2, 2009 (Ser. No. 12/384,309); "METHOD FOR MAKING THIN FILM TRANSISTOR", filed Apr. 2, 2009 (Ser. No. 12/384,331); "THIN FILM TRANSISTOR", filed Apr. 2, 2009 (Ser. No. 12/384,329); "THIN FILM TRANSISTOR", filed Apr. 2, 2009 (Ser. No. 12/384,310); "THIN FILM TRANSISTOR PANEL", filed Apr. 2, 2009 (Ser. No. 12/384,244); "THIN FILM TRANSISTOR", filed Apr. 2, 2009 (Ser. No. 12/384,281); "THIN FILM TRANSISTOR", filed Apr. 02, 2009 (Ser. No. 12/384,299); "THIN FILM TRANSISTOR", filed Apr. 2, 2009 (Ser. No. 12/384,292); "THIN FILM TRANSISTOR", filed Apr. 2, 2009 (Ser. No. 12/384,293); "THIN FILM TRANSISTOR", filed Apr. 2, 2009 (Ser. No. 12/384,330); "METHOD FOR MAKING THIN FILM TRANSISTOR", filed Apr. 2, 2009 (Ser. No. 12/384,241); "THIN FILM TRANSISTOR", filed Apr. 2, 2009 (Ser. No. 12/384,238). The disclosures of the above-identified applications are incorporated herein by reference.

BACKGROUND

1. Field of the Invention

The present invention relates to methods for making thin film transistors and, particularly, to a method for making a carbon nanotube based thin film transistor.

2. Discussion of Related Art

A typical thin film transistor (TFT) is made of a substrate, a gate electrode, an insulation layer, a drain electrode, a source electrode, and a semiconducting layer. The thin film transistor performs a switching operation by modulating an amount of carriers accumulated in an interface between the insulation layer and the semiconducting layer from an accumulation state to a depletion state, with applied voltage to the gate electrode, to change an amount of the current passing between the drain electrode and the source electrode. In practical use, a high carrier mobility affect by the material of the semiconducting layer of the thin film transistor is desired.

Usually, the material of the semiconducting layer is amorphous silicone (a-Si), poly-silicone (p-Si), or organic semiconducting material. The carrier mobility of an a-Si TFT is relatively lower than a p-Si TFT. However, the method for making the p-Si TFT is complicated and costly. The organic TFT is flexible but has low carrier mobility.

Carbon nanotubes (CNTs) are a novel carbonaceous material and have received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by small differences in the diameter and chirality affect. The carrier mobility of semiconducting carbon nanotubes along a length direction thereof can reach about 1000 to 1500 $cm^2V^{-1}S^{-1}$. Thus, TFTs adopting semiconducting carbon nanotubes as a semiconducting layer have been produced.

Methods for making carbon nanotube based TFTs include dispersing an amount of carbon nanotube powder in an organic solvent to form a mixture; printing the mixture on a substrate; volatilizing the organic solvent to achieve a carbon nanotube layer on the substrate; forming a source electrode and a drain electrode on the carbon nanotube layer; forming a silicon nitride layer on the carbon nanotube layer; and forming a gate electrode on the insulating layer.

However, there are problems with the present carbon nanotube based TFTs. Firstly, the carbon nanotubes are prone to aggregate in the mixture. Thus, the carbon nanotubes cannot be uniformly dispersed in the carbon nanotube layer. Secondly, the organic solvent is hard to eliminate from the carbon nanotube layer resulting in impurities in the carbon nanotube layer. Thirdly, metallic carbon nanotubes are formed in the carbon nanotuble layer which should be but are hard to eliminate. Additionally, the carbon nanotube layer formed by the printing method is inflexible. Accordingly, the TFT is inflexible.

BRIEF DESCRIPTION OF THE DRAWINGS

Many aspects of the present method for making the thin film transistor can be better understood with references to the following drawings. The components in the drawings are not necessarily drawn to scale, the emphasis instead being placed upon clearly illustrating the principles of the present method for making the carbon nanotube based thin film transistor.

Figure 1:
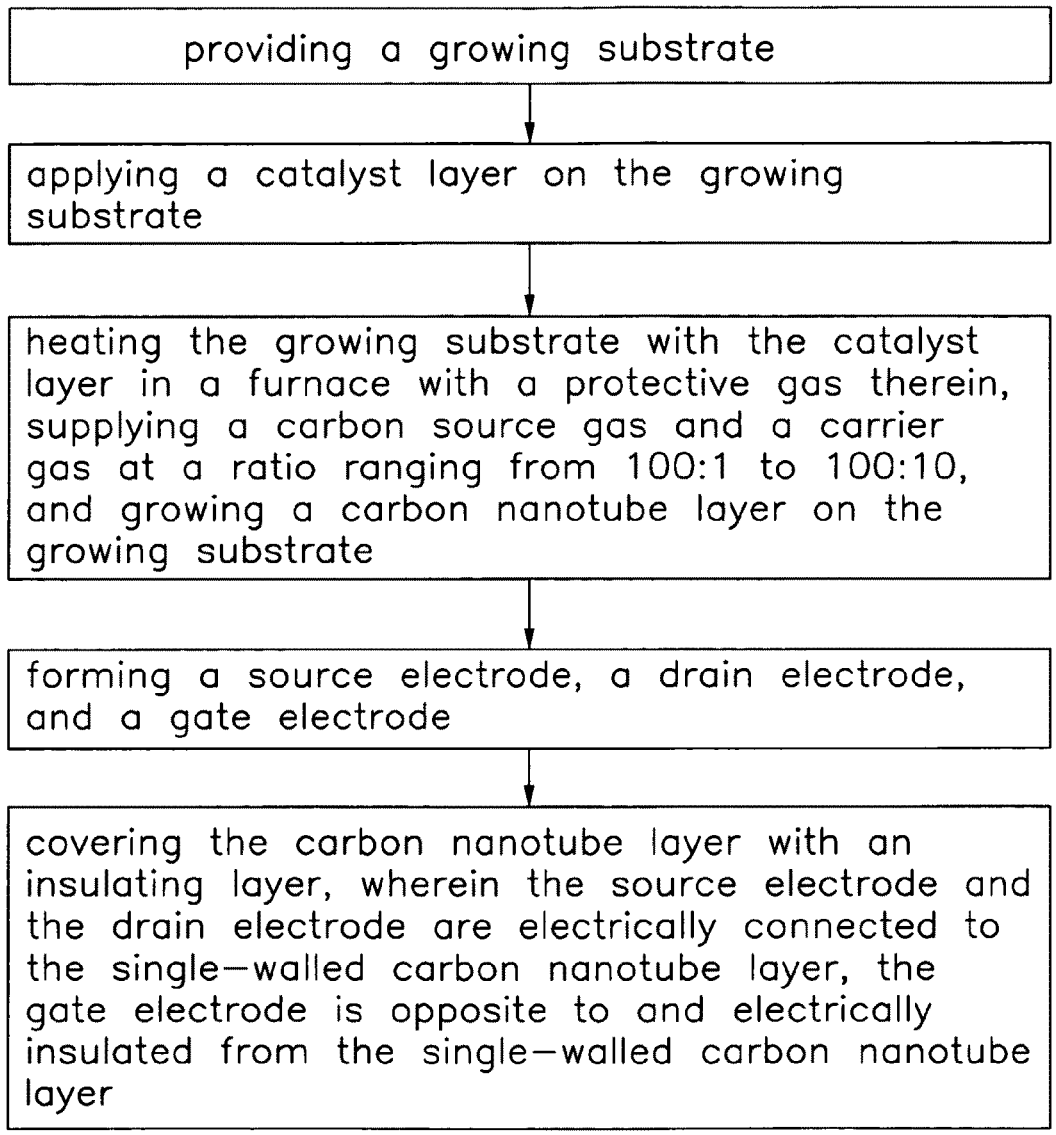
FIG. 1 is a flow chart of a method for making a thin film transistor in accordance with a first embodiment.

Corresponding reference characters indicate corresponding parts throughout the several views. The exemplifications set out herein illustrate at least one embodiment of the present method for making the thin film transistor, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present method for making the thin film transistor.

Figure 2:
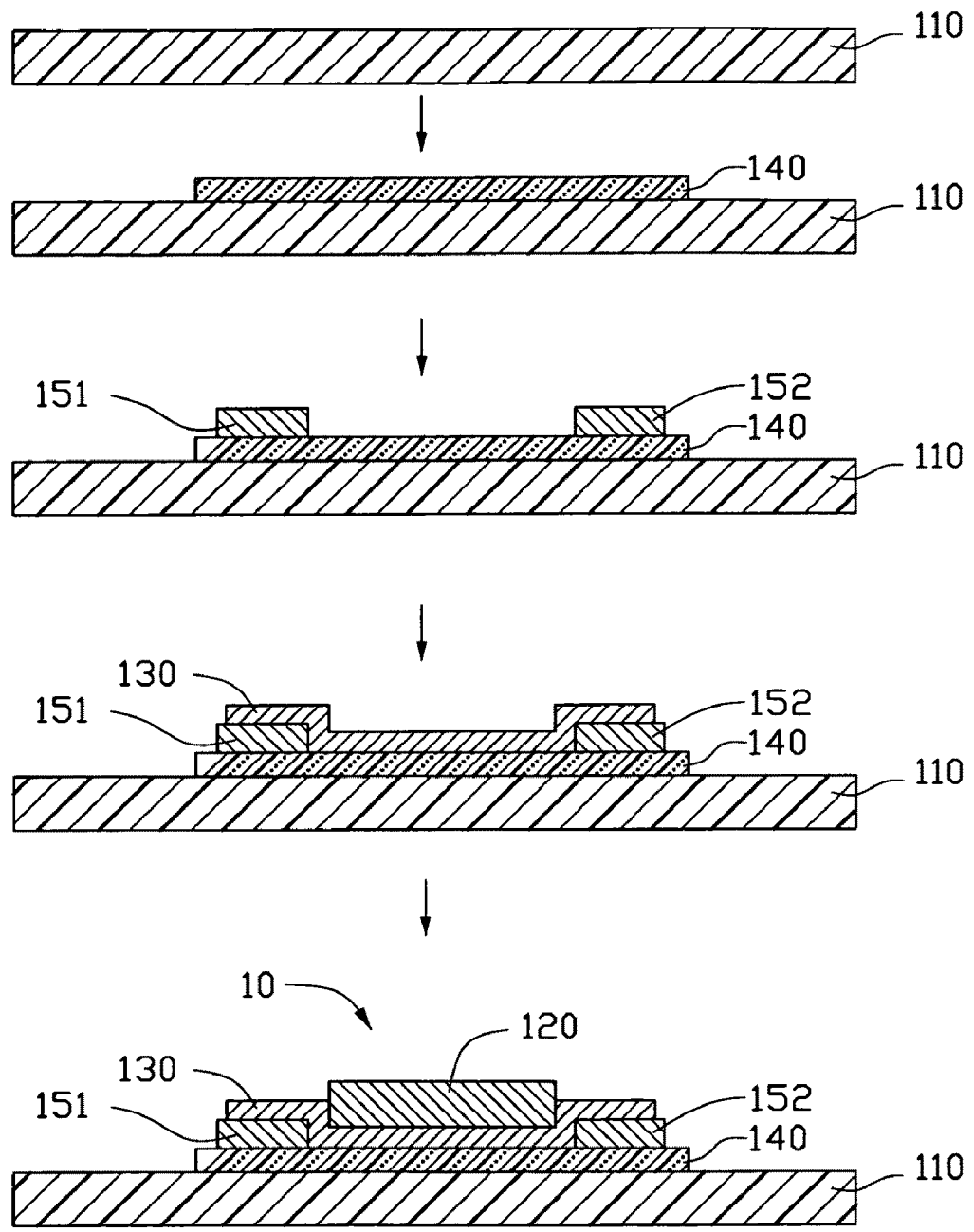
FIG. 2 is a schematic view of the method for making the thin film transistor of FIG. 1.

Referring to FIG. 1 and FIG. 2, a method for making a thin film transistor 10 having a top gate structure is provided in a first embodiment, and includes the following steps:

(a) providing a growing substrate 110;

(b) applying a catalyst layer on the growing substrate 110;

(c) heating the growing substrate 110 with the catalyst layer to a temperature approximately ranging from 500° C. to 740° C. in a furnace with a protective gas therein, supplying a carbon source gas and a carrier gas at a ratio ranging from 100:1 to 100:10, and growing a single-walled carbon nanotube layer 140 on the growing substrate 110;

(d) forming a source electrode 151, a drain electrode 152, and a gate electrode 120; and (e) covering the carbon nanotube layer 140 with an insulating layer 130, Wherein the source electrode 151 and the drain electrode 152 is spaced therebetween, and electrically connected to the single-walled carbon nanotube layer 140, the gate electrode 120 is opposite to and electrically insulated from the single-walled carbon nanotube layer 140 by the insulating layer 130.

In step (a), a surface of the growing substrate 110 is substantially flat and smooth, and the material of the growing substrate 110 is durable for high temperature. The material can be arbitrarily selected as desired (e.g., p-type or n-type silicon, silicon with a silicon dioxide film formed thereon, crystal, crystal with a oxide film formed thereon). The melting temperature of the material of the growing substrate 110 should be higher than the growing temperature of the carbon nanotubes in step (c) (e.g., >500° C.). In the present embodiment, a 4-inch P-type silicon wafer with a silicon dioxide film formed thereon is used as the growing substrate 110. In other embodiments, the material of the growing substrate 110 can be the same as a substrate of a printed circuit board (PCB). The shape and size of the growing substrate 110 is arbitrary.

In step (b), the catalyst layer can be made of metallic material (i.e., metal or alloy) such as iron (Fe), cobalt (Co), nickel (Ni), magnesium (Mg) or any alloy thereof, and sputtered on the growing substrate 110. A thickness of the catalyst layer is in a range from several nanometers to hundreds of nanometers. In the present embodiment, the material of the catalyst layer is Fe. The thickness of the catalyst layer is about 0.1 to 3 nanometers. The very thin catalyst layer helps the growing of the single-walled carbon nanotubes.

Step (c) further includes following substeps of: (c1) disposing the growing substrate with 110 the catalyst layer in a furnace; (c2) introducing a protective gas into the furnace and heating the growing substrate with 110 the catalyst layer to a temperature approximately ranging from 500° C. to 740° C.; (c3) introducing a carbon source gas and a carrier gas and reacting for about 5 to 30 minutes.

In step (c2), the protective gas can be made up of at least one of nitrogen ($N_2$), ammonia ($NH_3$), and a noble gas.

In step (c3), the mass flow of the carrier gas can be about 500 standard-state cubic centimeters per minute (sccm). The mass flow of the carbon source gas can be in an approximate range from 5 to 50 sccm. In the present embodiment, the mass flow of the carbon source gas is 20 sccm. The carrier gas is hydrogen. The carbon source gas can be selected in a group consisting of ethylene ($C_2H_4$), methane ($CH_4$), acetylene ($C_2H_2$), ethane ($C_2H_6$), carbon oxide (CO), or any combination thereof. In the present embodiment, the carbon source gas is $C_2H_2$.

The number of the walls of the carbon nanotubes growing in step (c) relates to the ratio of the carrier gas and the carbon source gas. When the ratio of the carrier gas and the carbon source gas is in the approximate range from 100:1 to 100:10, the carbon nanotubes in the present embodiment's carbon nanotube layer 140 are single-walled carbon nanotubes, and the diameter thereof is in the approximate range from 0.5 nanometers to 10 nanometers. In the present embodiment, the diameter of the carbon nanotubes in the carbon nanotube layer 140 is about 2 nanometers. A thickness of the carbon nanotube layer 140 is in the approximate range from 0.5 nanometers to 100 microns.

Figure 3:
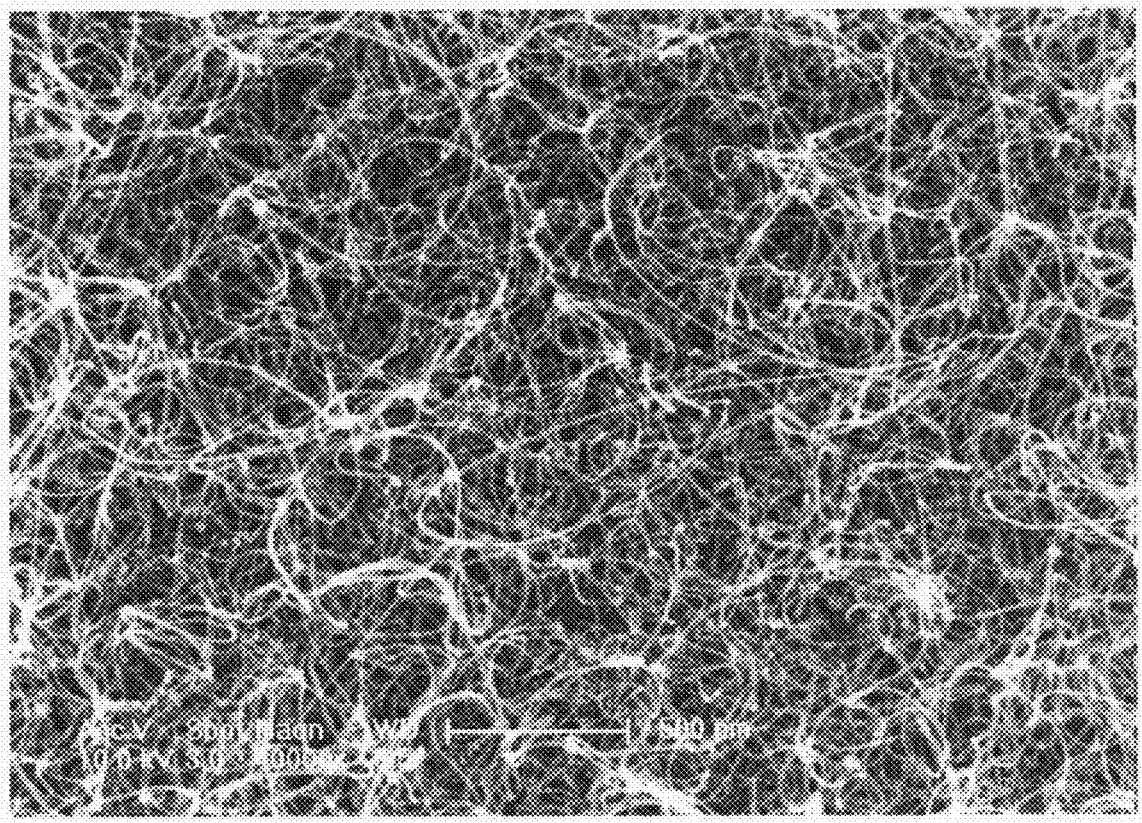
FIG. 3 shows a Scanning Electron Microscope (SEM) image of a carbon nanotube layer used in the thin film transistor of FIG. 1.

Referring to FIG. 3, the carbon nanotube layer 140 includes a plurality of carbon nanotubes with relatively small diameters (e.g., about 0.5 nanometers to 10 nanometers), and relatively long length (e.g., about 100 nanometers to 10 millimeters). Thus, the carbon nanotubes are disordered, curved and entangled one another. As controlling the growing condition of the carbon nanotube layer 140, the semiconducting carbon nanotubes therein is in an at least weight ratio of about 2/3, and the carbon nanotube layer 140 is essentially free of impurities such as carbonaceous or residual catalyst particles and has a high purity. It is to be understand that, the carbon nanotube layer can consist of only carbon nanotubes or can comprise composite layer including a plurality of carbon nanotubes and a matrix among other designs.

It is to be understood that, due to the high growing temperature of the carbon nanotube layer 140 in step (c), the material of the growing substrate 110 should be durable for high temperature. That is, the growing temperature restricts the material of the substrate for forming the thin film transistor. For forming the thin film transistor on an arbitrary substrate, especially on a flexible substrate, an additionally transfer printing step (g) can be further provided after step (c).

Figure 4:
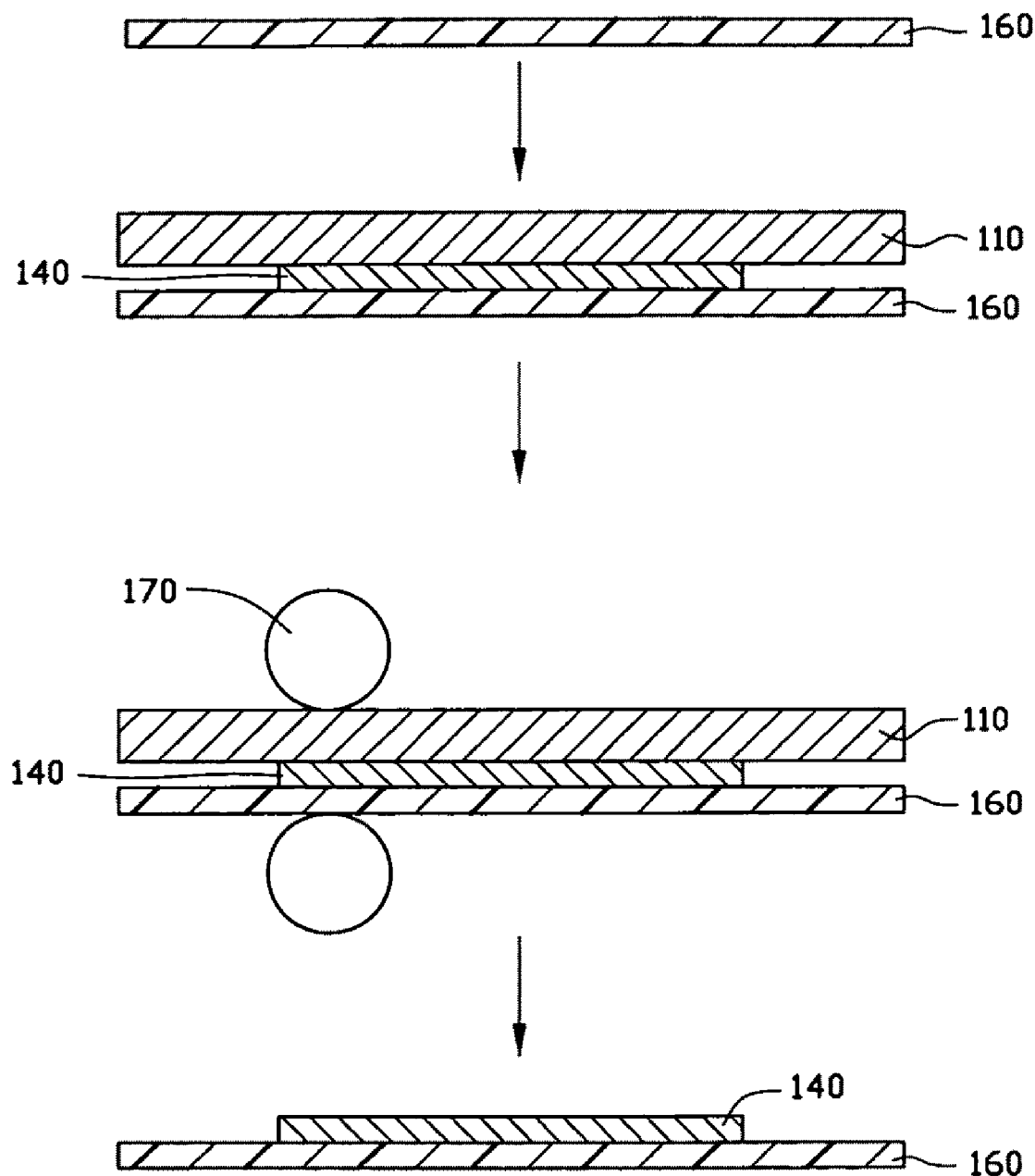
FIG. 4 is a schematic view of the method for transfer printing the carbon nanotube layer on the insulating substrate.

Referring to FIG. 4, the additional transfer printing step (h) includes following substeps of:

(h1) providing an insulating substrate 160;

(h2) inversing the growing substrate 110 with the carbon nanotube layer 140 formed thereon on the insulating substrate 160 and contacting the surface of the carbon nanotube layer 140 to the surface of the insulating substrate 160, and thereby forming a sandwiching structure including growing substrate 110, carbon nanotube layer 140, and insulating substrate 160 from top to bottom;

(h3) hot pressing the sandwiching structure at a temperature for a period of time; and (h4) removing the growing substrate 110, and thereby, and thereby, transferred printed the carbon nanotube layer 140 on the insulating substrate 160.

The sandwiching structure can be hot pressed in a hot pressing device 170 (e.g., between to hot rollers). The material of the insulating substrate 160 is flexible material such as plastic, polymer, or resin. In the present embodiment, the insulating substrate 160 is polyethylene terephthalate (PET) film. The temperature and pressing time for hot pressing are determined by the material of the insulating substrate 160 (e.g., about 50 to 100° C. for 5 to 30 minutes for plastic, polymer, or resin).

It is noted that because the carbon nanotube layer 140 has a high purity and a high specific surface area, the carbon nanotube layer 140 is adherent in nature. As such, the carbon nanotube layer 140 can be directly adhered to the surface of the insulating substrate 160 in step (h2). After hot pressing in step (h3), the carbon nanotube layer 140 can be firmly adhered on the surface of the insulating substrate 160. Due to the different materials of the insulating substrate 160 and the growing substrate 110, the cohesions between the substrates and the carbon nanotube layer 140 are different. The insulating substrate 160 material can be selected so that the cohesion between the insulating substrate 160 and the carbon nanotube layer 140 is lager than that between the growing substrate 110 and the carbon nanotube layer 140. Thus, the growing substrate 110 can be peeled off from the sandwich structure easily, and thus, the carbon nanotube layer 140 is transferred printed on the insulating substrate 160.

In step (d), the material of the source electrode 151, the drain electrode 152, and the gate electrode 120 has a good conductive property, and can be selected from a group consisting of pure metals, metal alloys, indium tin oxide (ITO), antimony tin oxide (ATO), silver paste, conductive polymer, and metallic carbon nanotubes. A thickness of the source electrode 151, the drain electrode 152, and the gate electrode 120 is about 0.5 nanometers to 100 microns. A distance between the source electrode 151 and the drain electrode 152 is about 1 to 100 microns.

In one embodiment, when the source electrode 151, the drain electrode 152, and the gate electrode 120 are made of pure metals, metal alloys, indium tin oxide (ITO), or antimony tin oxide (ATO), a conducting layer can be formed by a depositing, sputtering, evaporating method, and etched to form the source electrode 151 and the drain electrode 152. In other embodiments, the source electrode 151, the drain electrode 152, and the gate electrode 120 are made of silver paste or conductive polymer can be formed directly by a print method. In other embodiment, two carbon nanotube films with metallic carbon nanotube therein can be separately adhered on the substrate or the carbon nanotube layer 140 to form the source electrode 151 and the drain electrode 152, and can be adhered on the insulating layer 130 to form the gate electrode 120.

In the present embodiment, the source electrode 151 and the drain electrode 152 are separately formed on two ends of the carbon nanotube layer 140. Some of the carbon nanotubes in the carbon nanotube layer 140 aligned along a direction from the source electrode 151 to the drain electrode 152, to form a carrier channel from the source electrode 151 to the drain electrode 152.

In the present embodiment, the material of the source electrode 151, the drain electrode 152, and the gate electrode 120 is pure metal, and step (d) can be performed by a lift-off method or an etching method. The thickness of the source electrode 151 and the drain electrode 152 is about 1 micron. The distance between the source electrode 151 and the drain electrode 152 is about 50 microns.

It is to be understood that, to achieve a semiconducting layer, an additional step (g) of eliminating the metallic carbon nanotubes in the carbon nanotube layer 140 can be further provided. In one embodiment, the step (g) can be performed after step (c), by applying a voltage between the source electrode 151 and the drain electrode 152, to break down the metallic carbon nanotubes in the carbon nanotube layer 140, and thereby achieve a semiconducting layer free of metallic carbon nanotubes therein. The voltage is in a range from 1 to 1000 volts (V). In other embodiments, the step (g) can be performed after step (c), by irradiating the carbon nanotube layer 140 with a hydrogen plasma, microwave, terahertz (THz), infrared (IR), ultraviolet (UV), or visible light (Vis), to break down the metallic carbon nanotubes in the carbon nanotube layer 140, and thereby achieve a semiconducting layer free of metallic carbon nanotubes therein.

In step (e), the material of the insulating layer 130 can be a rigid material such as silicon nitride ($Si_3N_4$) or silicon dioxide ($SiO_2$), or a flexible material such as PET, benzocyclobutenes (BCB), or acrylic resins. The insulating layer 130 can be depositing, sputtering, evaporating, or printing method according to the material thereof. A thickness of the insulating layer 130 can be in a range from 0.5 nanometers to 100 microns.

In the present embodiment, a $Si_3N_4$ insulating layer 130 is deposited on the carbon nanotube layer 140, the source electrode 151, and the drain electrode 152 by a PECVD method. The thickness of the insulating layer 130 is about 1 micron.

To be used in a device (e.g., a display), the insulating layer 130 can be further etched to form exposure holes to expose a part of the source electrode 151, and the drain electrode 152.

Figure 5:
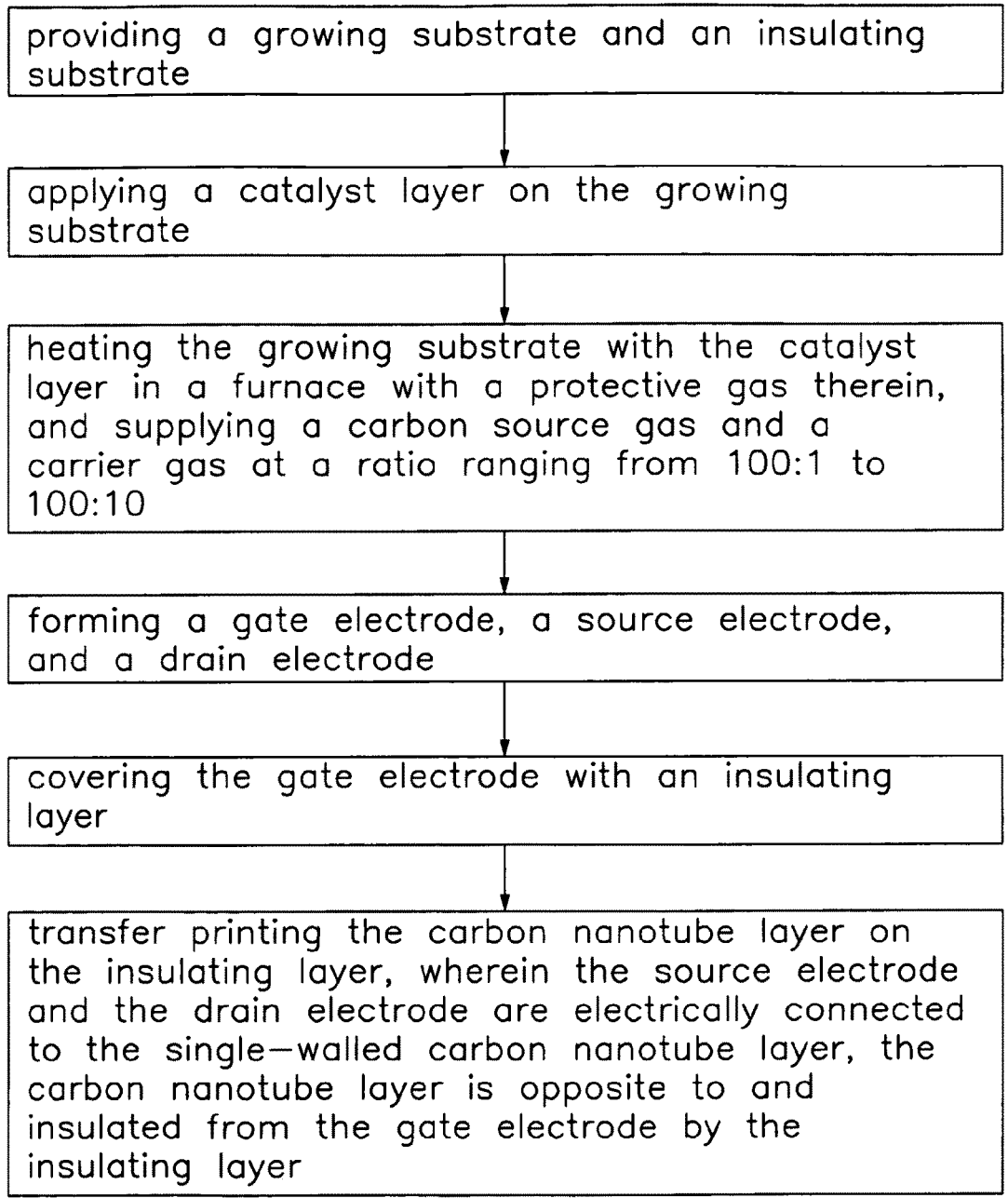
FIG. 5 is a flow chart of a method for making a thin film transistor in accordance with a second embodiment.
Figure 6:
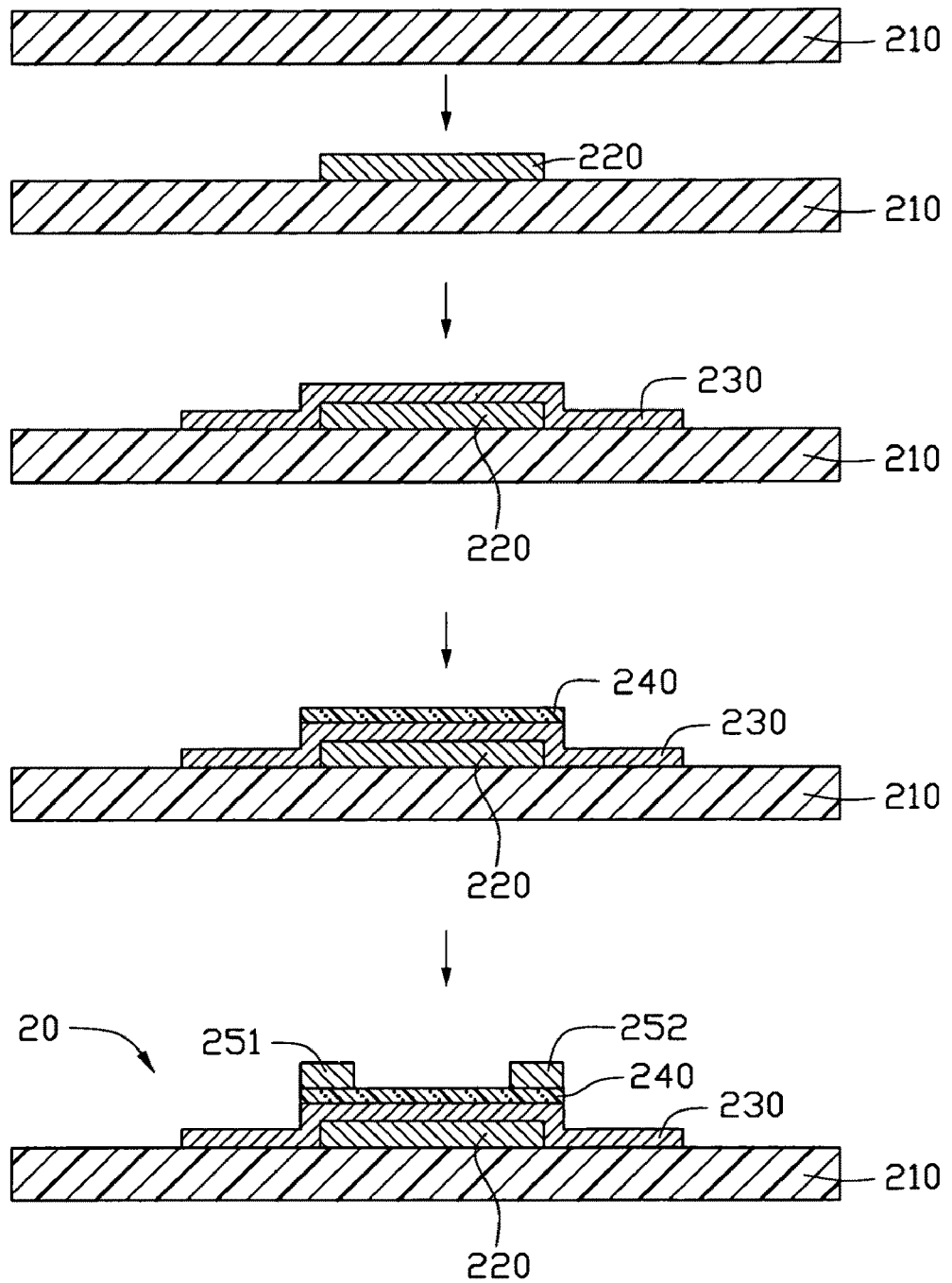
FIG. 6 is a schematic view of the method for making the thin film transistor of FIG. 5.

Referring to FIG. 5 and FIG. 6, a method for making the thin film transistor 20 having a bottom gate structure is provided in a second embodiment, and is substantially the same as the method form making the thin film transistor 10 in the first embodiment. The main difference between the two methods is that the thin film transistor 20 has a bottom gate structure.

The method for making the thin film transistor 20 includes steps of:
(a) providing a growing substrate and an insulating substrate 210;
(b) applying a catalyst layer on the growing substrate;
(c) heating the growing substrate with the catalyst layer to a temperature approximately ranging from 500° C. to 740° C. in a furnace with a protective gas therein, supplying a carbon source gas and a carrier gas at a ratio ranging from 100:1 to 100:10, and growing a single-walled carbon nanotube layer 240 on the growing substrate;
(d') forming a gate electrode 220, a source electrode 251 and a drain electrode 252;
(e') covering the gate electrode 220 with an insulating layer 230; and
(f') transfer printing the carbon nanotube layer 240 on the insulating layer 230,
wherein the source electrode 251 and the drain electrode 252 is spaced therebetween, and electrically connected to the single-walled carbon nanotube layer 240, the carbon nanotube layer 240 is opposite to and insulated from the gate electrode 220 by the insulating layer 230.

Figure 7:
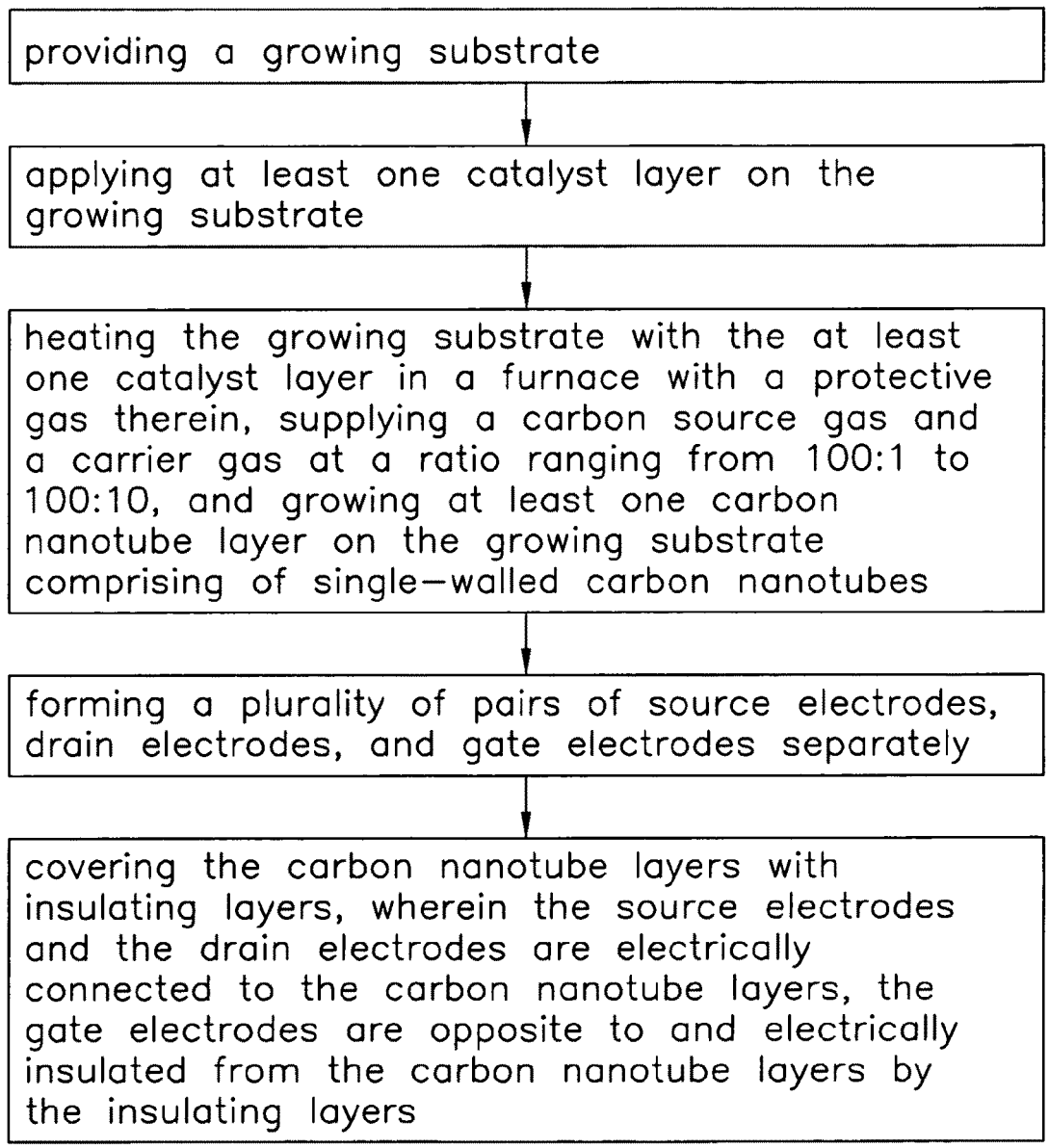
FIG. 7 is a flow chart of a method for making a thin film transistor in accordance with a third embodiment.

Referring to FIG. 7, a method for making an array of thin film transistors is provided in a third embodiment, and is substantially the same as the method for making the thin film transistor 10 in the first embodiment. The main difference is that, in the third embodiment, a plurality of thin film transistors is formed on the same substrate, thereby achieving the array of thin film transistors.

The method for making the array of thin film transistors includes steps of:
(a) providing a growing substrate;
(b") applying at least one catalyst layer on the growing substrate;
(c") heating the growing substrate with the at least one catalyst layer to a temperature approximately ranging from 500° C. to 740° C. in a furnace with a protective gas therein, supplying a carbon source gas and a carrier gas at a ratio ranging from 100:1 to 100:10, and growing at least one carbon nanotube layer on the growing substrate comprising of single-walled carbon nanotubes;
(d") forming a plurality of pairs of source electrodes, drain electrodes, and gate electrodes separately; and
(e") covering the carbon nanotube layers with insulating layers,
wherein the source electrodes and the drain electrodes are spaced therebetween, and electrically connected to the carbon nanotube layers, the gate electrodes are opposite to and electrically insulated from the carbon nanotube layers by the insulating layers.

In step (b"), a single large area catalyst layer or a plurality of catalyst layers can be formed on the growing substrate and separate to each other. Specifically, when forming a plurality of catalyst layers, the large area catalyst layer can be formed on the substrate firstly. Then, the large area catalyst layer can be patterned by etching or cutting with laser beam, to form a plurality of catalyst layers at desired locations on the growing substrate. In the present embodiment, an array of catalyst layers is formed on the growing substrate. The catalyst layers are arranged along columns and rows.

When a single large area catalyst layer is formed in step (b"), in step (c"), after growing, the carbon nanotube layer can be further cut by laser beam, or etched by plasma to form carbon nanotube layers at desired locations on the growing substrate. In the present embodiment, an array of carbon nanotube layers is formed on the growing substrate. The carbon nanotube layers are arranged along columns and rows.

When a plurality of catalyst layers are formed in step (b"), in step (c"), a plurality of carbon nanotube layers can be directly grown from the locations of the catalyst layer on the growing substrate. Thus, the cutting or etching step of the carbon nanotube layer is needless.

It is to be understood that, similar to the first embodiment, after step (c"), the carbon nanotube layers can be transfer printed on another insulating substrate (e.g., a flexible insulating substrate) like the method in the second embodiment.

In step (d"), a conductive layer can be formed on the entire carbon nanotube layers, and patterned by an etching step to form a plurality of source electrodes and drain electrodes separately connected to the carbon nanotube layers. Further, when the insulating layers covers the carbon nanotube layers, another conductive layer can be formed on the entire insulating layers, and patterned by an etching step to form a plurality of gate electrodes opposite to the carbon nanotube layers.

In step (e"), an insulating layer can be formed on the whole carbon nanotube layers, source electrodes and drain electrodes, and then patterned by an etching step to form a plurality of insulating layers corresponding to the carbon nanotube layers.

Figure 8:
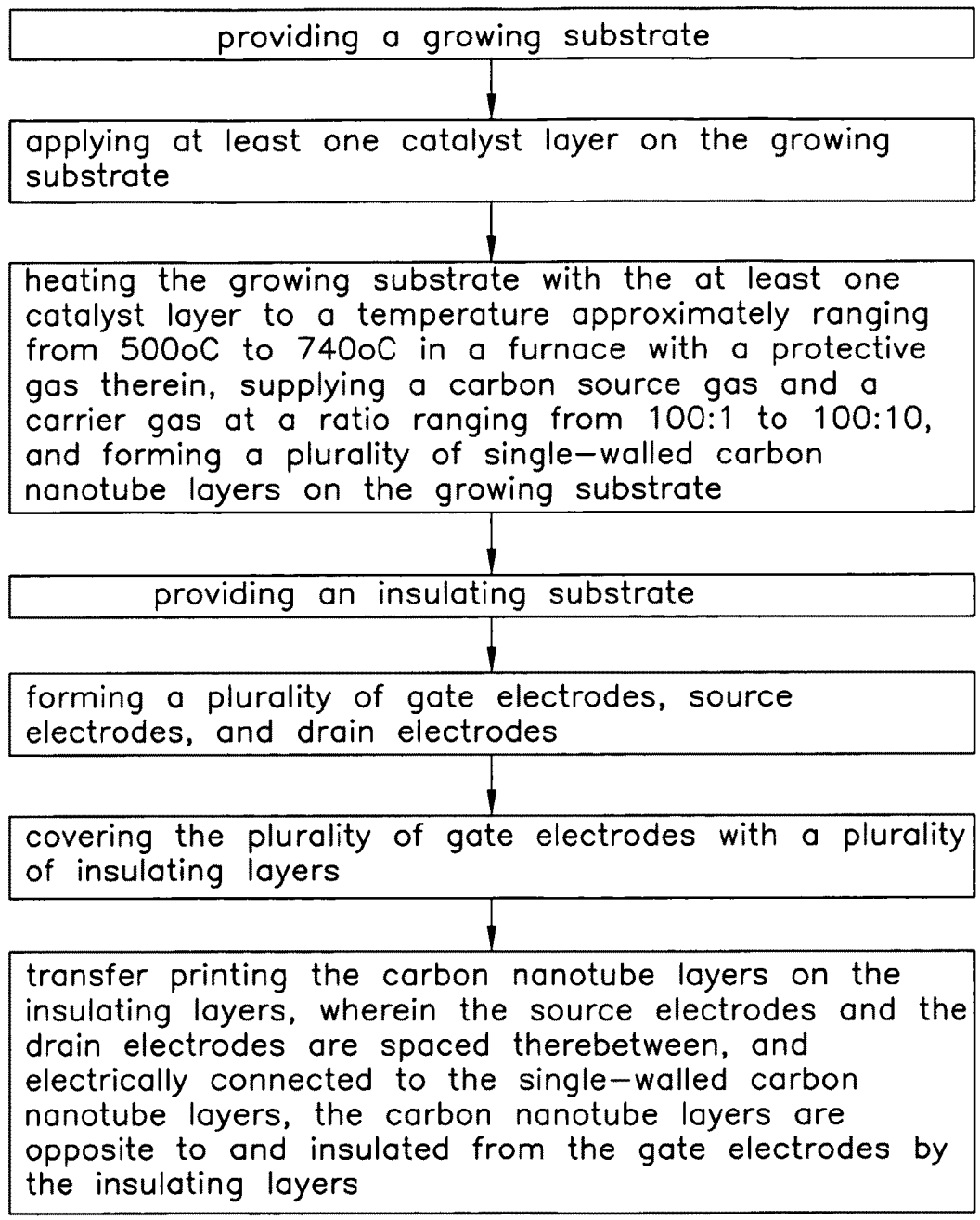
FIG. 8 is a flow chart of a method for making a thin film transistor in accordance with a fourth embodiment.

It is to be understood that, the array of thin film transistors can be formed in a similar way of the second embodiment. Referring to FIG. 8, the method for forming the array of thin film transistors includes following steps of:
(a) providing a growing substrate;
(b''') applying at least one catalyst layer on the growing substrate;
(c''') heating the growing substrate with the at least one catalyst layer to a temperature approximately ranging from 500° C. to 740° C. in a furnace with a protective gas therein, supplying a carbon source gas and a carrier gas at a ratio ranging from 100:1 to 100:10, and forming a plurality of single-walled carbon nanotube layers on the growing substrate;
(d''') providing an insulating substrate;
(e''') forming a plurality of gate electrodes, source electrodes, and drain electrodes;
(f''') covering the plurality of gate electrodes with a plurality of insulating layers; and
(g''') transfer printing the carbon nanotube layers on the insulating layers,
wherein the source electrodes and the drain electrodes are spaced therebetween, and electrically connected to the single-walled carbon nanotube layers, the carbon nanotube layers are opposite to and insulated from the gate electrodes by the insulating layers.

The method for making the thin film transistor provided in the present embodiments has the following superior properties. Firstly, the carbon nanotube layer is directly grown on the growing substrate. As the catalyst layer is uniform, the carbon nanotubes in the carbon nanotube layer are uniformly grown. The purity of the carbon nanotube layer is relatively high because of the growing method. Secondly, the diameter and wall number of the carbon nanotubes can be controlled by the ratio of the carrier gas and the carbon source gas and thereby, achieve semiconducting carbon nanotubes. Thus, the carrier mobility of the thin film transistor using the carbon nanotube layer as a semiconductor layer is relatively high. Thirdly, the carbon nanotubes in the carbon nanotube layer entangle with each other to improve the toughness and flexibility of the carbon nanotube layer. Thus, the flexibility of the thin film transistor can be improved. Fourthly, the carbon nanotube layer is adhesive and can be easily adhered in a desired location at a low temperature (e.g., room temperature). Thus, the carbon nanotube layer can be transfer printed on the insulating substrate. The material of the insulating substrate can be selected from a flexible plastic or resin.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that above description and the claims drawn to a method may include some indication in reference to certain steps. However, the indication used is only to be viewed for identification purposes and not as a suggestion as to an order for the steps.

The invention claimed is:

1. A method for making a thin film transistor, the method comprising the steps of:
   (a) providing a growing substrate;
   (b) applying a catalyst layer on the growing substrate;
   (c) heating the growing substrate with the catalyst layer in a furnace with a protective gas therein, supplying a carbon source gas and a carrier gas at a ratio ranging from 100:1 to 100:10, and growing a carbon nanotube layer on the growing substrate;
   (d) forming a source electrode, a drain electrode, and a gate electrode; and
   (e) covering the carbon nanotube layer with an insulating layer,
   wherein the source electrode and the drain electrode are electrically connected to the single-walled carbon nanotube layer, the gate electrode is opposite to and electrically insulated from the single-walled carbon nanotube layer.

2. The method as claimed in claim 1, wherein in step (c), carbon nanotubes in the carbon nanotube layer comprise of semiconducting carbon nanotubes.

3. The method as claimed in claim 1, wherein the carbon nanotubes in the carbon nanotube layer are curved, disordered and entangled with each other.

4. The method as claimed in claim 1, wherein the material of the catalyst layer is selected from a group consisting of iron, cobalt, nickel, magnesium and any alloy thereof; a thickness of the catalyst layer is in a range from several nanometers to hundreds of nanometers.

5. The method as claimed in claim 1, wherein in step (c), the growing substrate with the catalyst layer is heated to a temperature approximately ranging from 500° C. to 740° C.

6. The method as claimed in claim 1, wherein in step (c), the carbon source gas and the carrier gas are introduced for 5 to 30 minutes.

7. The method as claimed in claim 1, wherein in step (c), the protective gas comprises of at least one of nitrogen, ammonia, and a noble gas; the carrier gas comprises of hydrogen, the carbon source gas is selected in a group consisting of ethylene, methane, acetylene, ethane, carbon oxide, and any combination thereof.

8. The method as claimed in claim 1, further comprising (h) a transfer printing step after step (c), and the transfer printing step (h) comprising following substeps of:
   (h1) providing an insulating substrate;
   (h2) placing the surface of the carbon nanotube layer on the surface of the insulating substrate;
   (h3) hot pressing; and (h4) removing the growing substrate from the carbon nanotube layer.

9. The method as claimed in claim 8, wherein the material of the insulating substrate is selected from a group consisting of plastic, polymer, resin, and combinations thereof.

10. The method as claimed in claim 1, wherein the source electrode and the drain electrode are formed directly on the carbon nanotube layer.

11. The method as claimed in claim 1, further comprising (g) eliminating metallic carbon nanotubes in the carbon nanotube layer.

12. The method as claimed in claim 11, wherein step (g) is performed after step (d), and comprises applying a voltage between the source electrode and the drain electrode to break down the metallic carbon nanotubes in the carbon nanotube layer, and thereby achieve a semiconducting layer free of metalic carbon nanotubes therein.

13. The method as claimed in claim 11, wherein step (g) is performed after step (c), and comprises irradiating the carbon nanotube layer with a hydrogen plasma, microwave, terahertz, infrared, ultraviolet, or visible light, to break down the metallic carbon nanotubes in the carbon nanotube layer, and thereby achieve a semiconducting layer free of metallic carbon nanotubes.

14. The method as claimed in claim 1, wherein in step (e), the insulating layer covers the source electrode and the drain electrode, and step (e) further comprises a step of exposing a part of the source electrode and the drain electrode from the insulating layer.

15. A method for making a thin film transistor, the method comprising the steps of:
(a) providing a growing substrate and an insulating substrate,
(b) applying a catalyst layer on the growing substrate;
(c) heating the growing substrate with the catalyst layer in a furnace with a protective gas therein, and supplying a carbon source gas and a carrier gas at a ratio ranging from 100:1 to 100:10;
(d') forming a gate electrode, a source electrode, and a drain electrode;
(e') covering the gate electrode with an insulating layer; and
(f') transfer printing the carbon nanotube layer on the insulating layer,
wherein the source electrode and the drain electrode are electrically connected to the single-walled carbon nanotube layer, the carbon nanotube layer is opposite to and insulated from the gate electrode by the insulating layer.

16. A method for making thin film transistors, the method comprising the steps of:
(a) providing a growing substrate;
(b") applying at least one catalyst layer on the growing substrate;
(c") heating the growing substrate with the at least one catalyst layer in a furnace with a protective gas therein, supplying a carbon source gas and a carrier gas at a ratio ranging from 100:1 to 100:10, and growing at least one carbon nanotube layer on the growing substrate comprising of single-walled carbon nanotubes;
(d") forming a plurality of pairs of source electrodes, drain electrodes, and gate electrodes separately; and
(e") covering the carbon nanotube layers with insulating layers,
wherein the source electrodes and the drain electrodes are electrically connected to the carbon nanotube layers, the gate electrodes are opposite to and electrically insulated from the carbon nanotube layers by the insulating layers.

17. The method as claimed in claim 16, wherein in step (b"), a large area catalyst layer is formed on the substrate and patterned by etching or cutting with laser beam, to form a plurality of catalyst layers at desired locations on the growing substrate.

18. The method as claimed in claim 16, wherein in step (c"), the carbon nanotube layer is cut by laser beam, or etched by plasma to form carbon nanotube layers at desired locations on the growing substrate.

19. The method as claimed in claim 16, wherein after step (c"), the carbon nanotube layers are transfer printed on another insulating substrate.

* * * * *